United States Patent [19]
Chor et al.

[11] Patent Number: 5,801,077
[45] Date of Patent: Sep. 1, 1998

[54] METHOD OF MAKING SIDEWALL POLYMER ON POLYCIDE GATE FOR LDD STRUCTURE

[75] Inventors: Calvin Leung Yat Chor; Mei Sheng Zhou, both of Singapore, Singapore

[73] Assignee: Chartered Semiconductor Manufacturing Ltd., Singapore, Singapore

[21] Appl. No.: 635,994

[22] Filed: Apr. 22, 1996

[51] Int. Cl.$^6$ .................................... H01L 21/336
[52] U.S. Cl. .................. 438/305; 438/303; 438/695; 438/696; 438/306
[58] Field of Search ........................ 438/303, 305, 438/306, 695, 696

[56] References Cited

U.S. PATENT DOCUMENTS

| | | | |
|---|---|---|---|
| 4,528,066 | 7/1985 | Merkling, Jr. ......................... | 438/696 |
| 4,818,334 | 4/1989 | Shwartzman et al. ................ | 438/669 |
| 4,994,404 | 2/1991 | Sheng et al. .......................... | 437/44 |
| 5,032,535 | 7/1991 | Kamijo et al. ........................ | 437/44 |
| 5,471,080 | 11/1995 | Satoh et al. .......................... | 257/344 |

Primary Examiner—Trung Dang
Attorney, Agent, or Firm—George O. Saile; Stephen B. Ackerman; Rosemary L.S. Pike

[57] ABSTRACT

A method for forming an LDD structure using a polymeric spacer on a polysilicon or a polycide gate is described. A layer of gate silicon oxide is provided over the surface of a semiconductor substrate. A polysilicon or polycide layer is provided overlying the gate silicon oxide layer. The polysilicon or polycide layer is covered with a photoresist layer which is patterned to form a mask. The polysilicon or polycide layer is etched away where it is not covered by the mask to form gate electrodes whereby a polymer is formed on the sidewalls of the mask and the gate electrodes. First ions are implanted into the semiconductor substrate not covered by the mask and the polymer to form source and drain regions. The polymer and mask are removed. Second ions are implanted into the semiconductor substrate whereby lightly doped source and drain regions are formed within the semiconductor substrate which was covered by the polymer completing the formation of a lightly doped source and drain structure in the fabrication of an integrated circuit device.

33 Claims, 4 Drawing Sheets

1

METHOD OF MAKING SIDEWALL POLYMER ON POLYCIDE GATE FOR LDD STRUCTURE

BACKGROUND OF THE INVENTION

(1) Field of the Invention

The invention relates to the fabrication of integrated circuit devices, and more particularly, to a method of improved LDD structure in the fabrication of integrated circuits.

(2) Description of the Prior Art

A typical LDD (lightly doped source and drain) structure is formed by an LDD mask implant followed by spacer oxide deposition and etching and then a source/drain mask implant. As devices shrink to the quarter micron regime, the spacer oxide becomes thinner. There is a limitation to the spacer oxide deposition and etching process at such small feature sizes, leading to controllability and repeatability problems.

U.S. Pat. No. 4,994,404 to Sheng et al show the use of a deposited polymeric spacer. U.S. Pat. No. 5,032,535 to Kamijo et al teach a method of forming first the N+ region and then the N− region.

SUMMARY OF THE INVENTION

A principal object of the present invention is to provide an effective and very manufacturable method of forming an LDD structure.

A further object of the invention is to provide a controllable and reliable method of forming an LDD structure with a feature size in the quarter micron range.

Yet another object is to provide a method of forming an LDD structure using a polymeric spacer on a polysilicon gate.

Yet another object is to provide a method of forming an LDD structure using a polymeric spacer on a polycide gate.

In accordance with the objects of this invention a method for forming an LDD structure using a polymeric spacer on a polysilicon or a polycide gate is achieved. A layer of gate silicon oxide is provided over the surface of a semiconductor substrate. A polysilicon or polycide layer is provided overlying the gate silicon oxide layer. The polysilicon or polycide layer is covered with a photoresist layer which is patterned to form a mask. The polysilicon or polycide layer is etched away where it is not covered by the mask to form gate electrodes whereby a polymer is formed on the sidewalls of the mask and the gate electrodes. First ions are implanted into the semiconductor substrate not covered by the mask and the polymer to form source and drain regions. The polymer and mask are removed. Second ions are implanted into the semiconductor substrate whereby lightly doped source and drain regions are formed within the semiconductor substrate which was covered by the polymer completing the formation of a lightly doped source and drain structure in the fabrication of an integrated circuit device.

BRIEF DESCRIPTION OF THE DRAWINGS

In the accompanying drawings forming a material part of this description, there is shown:

FIGS. 1 through 6 schematically illustrate in cross-sectional representation a preferred embodiment of the present invention.

DESCRIPTION OF THE PREFERRED EMBODIMENTS

Figure 1:
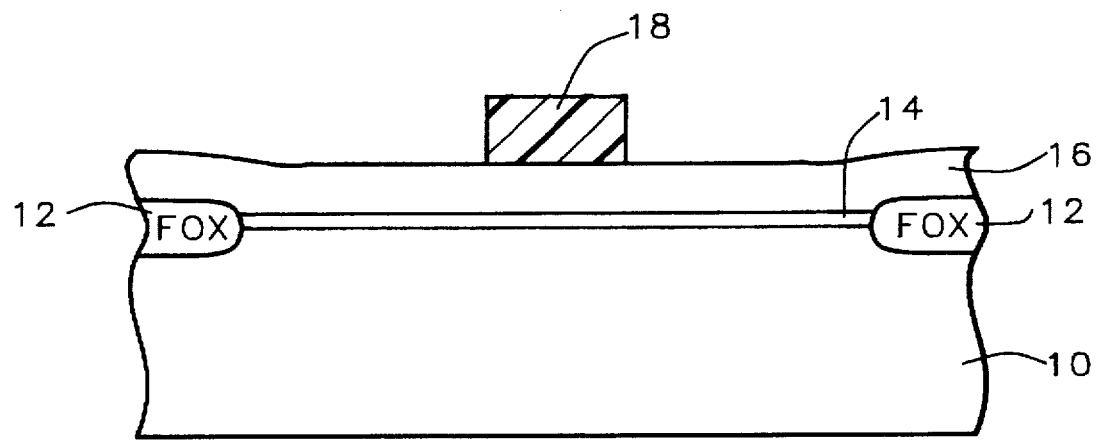

Referring now more particularly to FIG. 1, there is shown an illustration of the N channel portion of a partially completed, CMOS metal oxide field effect transistor (MOSFET) and capacitor. The semiconductor substrate 10 is preferably composed of silicon having a (100) crystallographic orientation. In an effort to simplify the description and the drawings the dielectric isolation between devices has been only partially shown and will not be described in detail, because they are conventional. For example, Field OXide regions 12 are formed in and on the semiconductor substrate. Then semiconductor devices can be provided in the silicon mesas according to the following processes.

The surface of the silicon substrate 10 is thermally oxidized to form the desired gate oxide 14 thickness. The preferred thickness is between about 50 to 125 Angstroms.

A polysilicon layer 16 is deposited by low pressure chemical vapor deposition (LPCVD) to a thickness of between about 2500 to 4500 Angstroms. Alternatively, a polycide layer is formed by depositing a layer of polysilicon by LPCVD to a thickness of between about 1400 to 2000 Angstroms, followed by a layer of tungsten silicide deposited by chemical vapor deposition (CVD) to a thickness of between about 1200 to 1700 Angstroms, topped with a layer of polysilicon deposited by LPCVD to a thickness of between about 450 to 650 Angstroms for a total layer 16 thickness of between about 3050 to 4350 Angstroms.

A layer of photoresist is coated over the polysilicon or polycide layer 16 and patterned as is conventional in the art to form a photoresist mask 18 where gate electrodes and/or interconnecting lines are to be formed.

Figure 2:
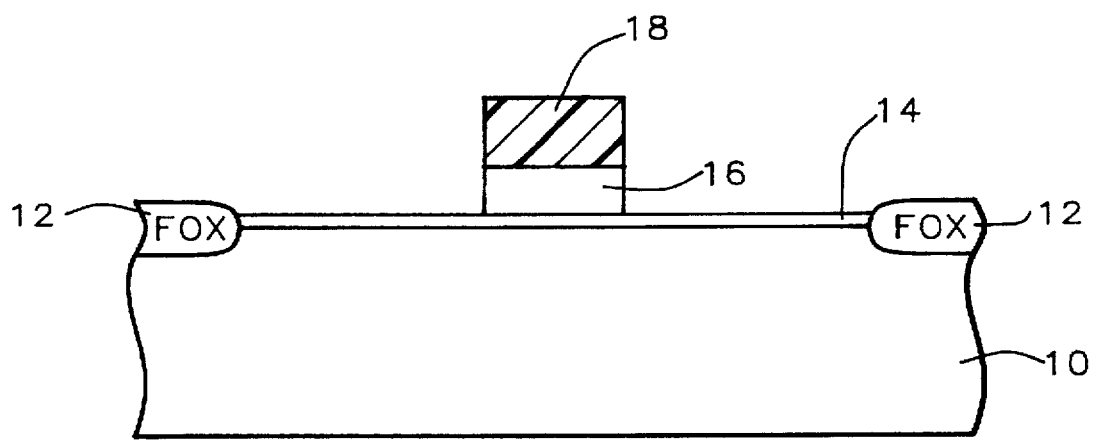

The key process of the invention is the formation of an in-situ gate polymer on the gate sidewalls to eliminate the need for a spacer oxide deposition and etching. Referring now to FIG. 2, polysilicon or polycide layer 16 is etched away where it is not covered by the mask 18 to form a gate electrode. The in-situ polymer deposit can be achieved by a variety of methods.

One method is to use HBr-$O_2$ plasma at the last overetching step of the gate etching. The first part of the etching is the regular gate etching process, using for example, $CCl_4$ or HBr, or the like. During the overetching step, HBr is flowed at the rate of between about 50 to 200 sccm. $O_2$ is flowed at between about 1 to 8 sccm under a low pressure of between about 5 to 10 mTorr and a low bottom power of less than about 150 watts. The HBr can be used at the overetching step to serve both the overetching and the polymer buildup function. Alternately, after the overetch is finished, the HBr and O2 flow can be tuned so that the polymer buildup is the only function performed. When the $O_2$ flow is greater than 5 sccm, the etching process will be stopped and the polymer will build up.

Another method of achieving the in-situ polymer deposit is to use hydrocarbon compounds to form the polymer. After the etching and overetching is complete, hydrocarbon compounds are added. Unsaturated hydrocarbons such as propene, styrene, methyl methacrylate, and the like can be used. Preferably, methyl methacrylate or propene are used. A trace amount of Cl· is generated by $Cl_2$ plasma or an organic radical R· is generated under plasma conditions to form the following polymers:

TABLE 1

| Hydrocarbon | Polymer |
|---|---|
| $CH_3CH=CH_2 \xrightarrow{Cl. \text{ or } R.} $ | $+CH-CH_2+_n$<br>$\quad\|$<br>$\quad CH_3$ |
| $H_2C=C-CO_2CH_3 \xrightarrow{Cl. \text{ or } R.}$<br>$\quad\|$<br>$\quad CH_3$ | $+H_2C-C+_n$<br>$\qquad\|$<br>$\qquad CH_3$<br>with $CO_2CH_3$ on C |

Figure 3A:
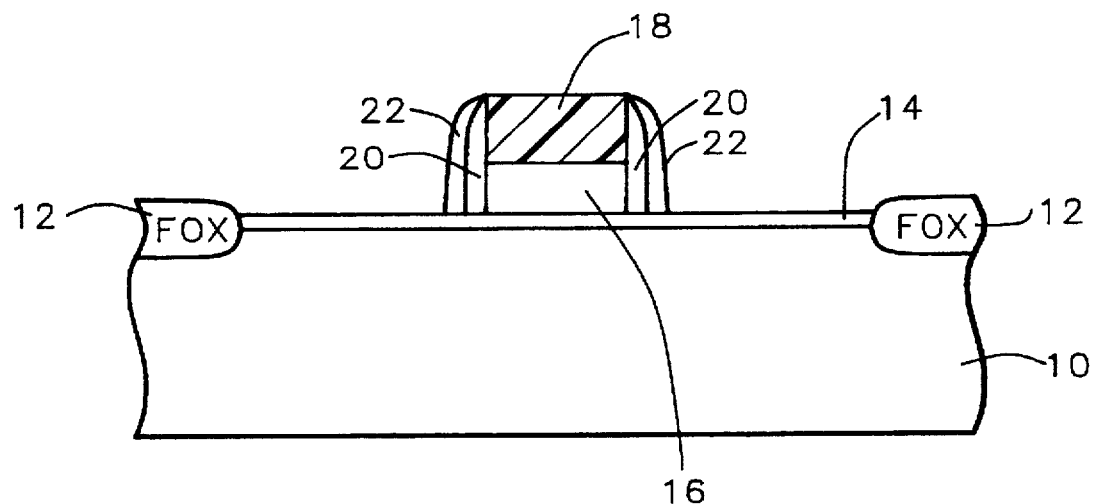
FIGS. 3A and 3B schematically illustrate in cross-sectional representation alternate polymer formation methods.
Figure 3B:
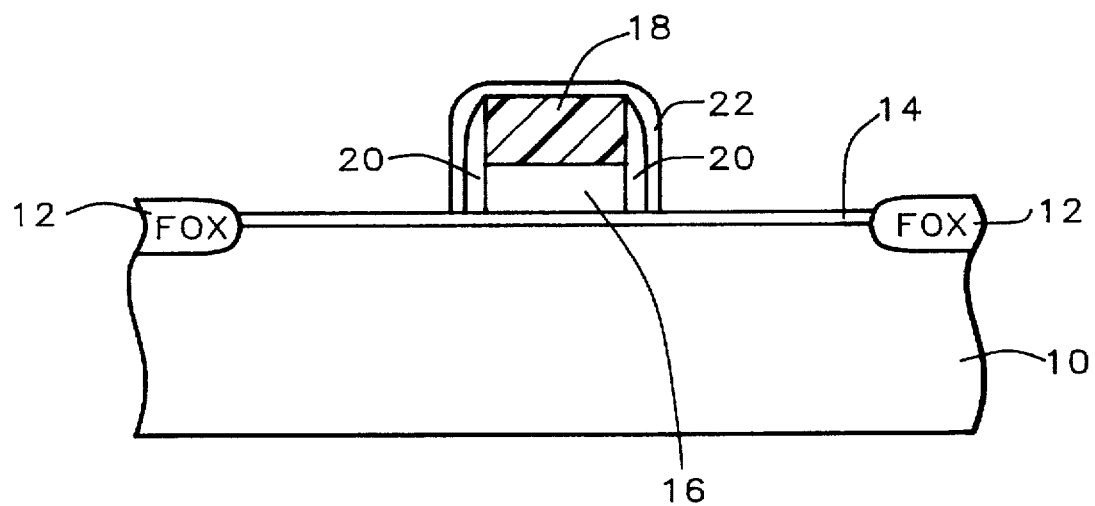

The in-situ polymer formation is illustrated in FIGS. 3A and 3B. Note that both FIGS. 2 and 3A illustrate the polycide etching step during which the polymer is formed.

In FIG. 3A, the polymer is formed during the overetching step according to the first method described hereinabove. Layers 20 and 22 represent the cumulative formation of polymer on the sidewalls of the gate electrode and the photoresist 18.

In FIG. 3B, the polymer is formed by the addition of hydrocarbons. Layers 20 and 22 are different types of polymer formed on the sidewalls of the gate electrode and the photoresist 18 and on the surface of the semiconductor substrate.

The target horizontal thickness of the polymer 20,22 on the sidewalls of the gate 16 is greater than about 500 Angstroms. The maximum thickness depends upon the application, but should be no more than about 2000 Angstroms.

The source/drain structure of the MOSFET may now be formed. FIGS. 1 through 6 show only the N channel MOSFET portion of a CMOS integrated circuit device. It is well understood by those skilled in the art that the P channel portion can be formed by simply substituting opposite polarities to those given for the N channel embodiment.

Figure 4:
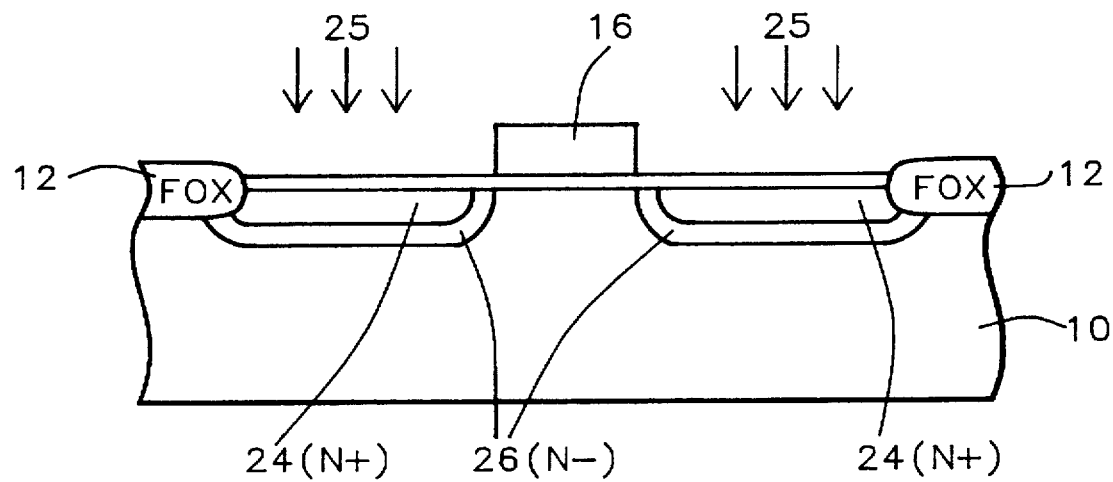

Referring now to FIG. 4, the LDD source/drain regions are formed by the ion implantation of N+ ions 23, such as phosphorus or arsenic to form the heavily doped regions 24, as shown in FIG. 4. The polymer sidewalls 20,22 and the photoresist mask 18 act as a mask for the ion implantation. For example, arsenic ions are implanted at a dosage of between about 1 E 15 to 1 E 18 atoms/cm² at an energy of between about 50 to 90 KeV. Or, phosphorus ions could be implanted at the same dosage, but at an energy of between about 30 to 80 KeV. The preferred dopant concentration for these regions 24 is between about 1 E 19 to 1 E 22 atoms/cm³.

Next, the polymer sidewalls 20,22 are removed. They can be removed along with the photoresist 18 in some photoresist stripping processes. Alternately, the polymer sidewalls can be removed, for example, by an organic solvent such as EKC 265 at an elevated temperature of between about 60° to 100° C. or by a $NH_4OH/H_2O_2$ dip at an elevated temperature of between about 40° to 80° C. This may be a megasonic dip.

If the photoresist has not already been removed, it is removed now such as by oxygen ashing in plasma or by a hot sulfuric peroxide, for example at between about 80° to 100° C. for between about 5 to 10 minutes.

Figure 5:
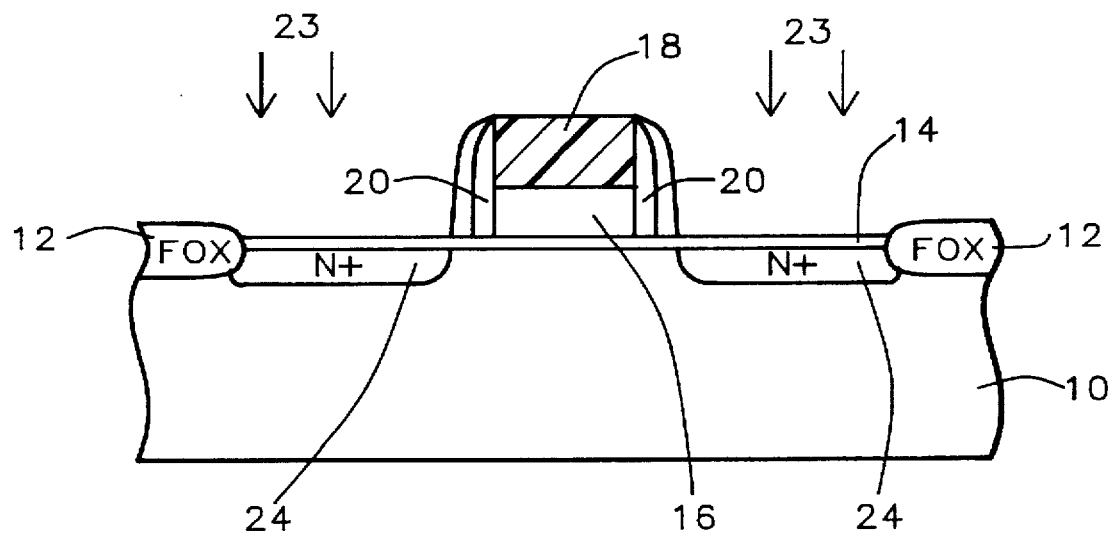

Referring now to FIG. 5, the lightly doped drain (LDD) N− regions are ion implanted 25. For example, arsenic ions are implanted at a dosage of between about 1 E 12 to 1 E 14 atoms/cm² at an energy of between about 50 to 90 KeV. Or, phosphorus ions could be implanted at the same dosage, but at an energy of between about 30 to 80 KeV. The typical dopant concentration for the regions 26 is P31 at between about 1 E 17 to 1 E 19 atoms/cm³.

Figure 6:
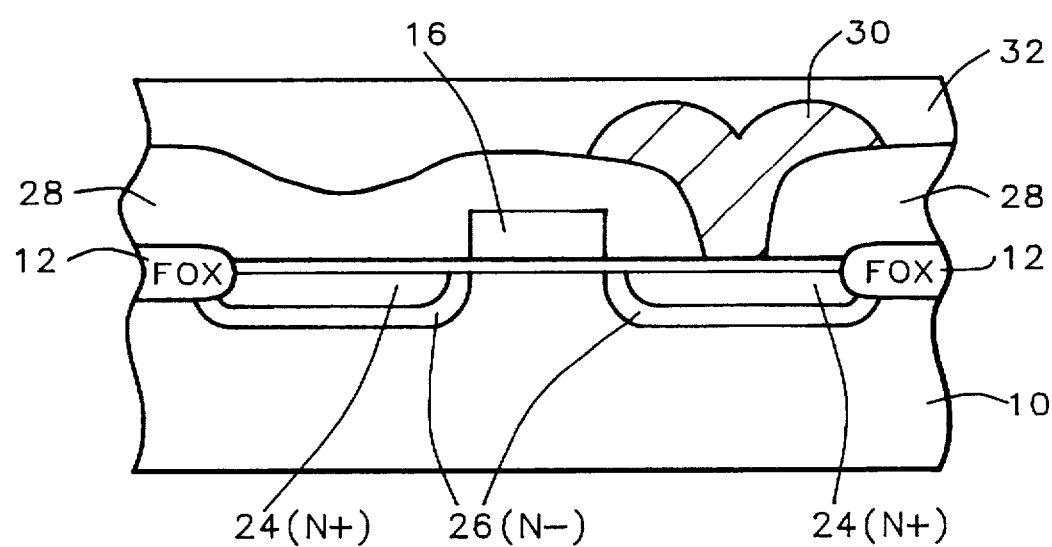

This completes the formation of the LDD structure. The integrated circuit device is completed as is conventional in the art. For example, as illustrated in FIG. 6, insulating layer 28 is deposited over the surface of the substrate. Contact openings are made through the insulating layer to the underlying semiconductor devices, such as to a source/drain region 24. A metal layer 30 is deposited and patterned to form electrical connections between the elements of the integrated circuit. A passivation layer 32 completes the fabrication of the integrated circuit device.

The process of the invention provides an in-situ polymer sidewall which acts as an implantation mask in the formation of an LDD structure. This in-situ polymer sidewall eliminates the need for a spacer oxide deposition and etching, thus providing a reliable, controllable and repeatable process especially suited for quarter micron feature sizes.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a layer of gate silicon oxide over the surface of a semiconductor substrate;

providing a gate conducting layer overlying said gate silicon oxide layer;

covering said gate conducting layer with a photoresist layer and patterning said photoresist layer to form a mask;

etching away said gate conducting layer where it is not covered by said mask to form gate electrodes whereby a polymer is formed on the sidewalls of said mask and said gate electrodes;

implanting first ions into said semiconductor substrate not covered by said mask and said polymer to form source and drain regions;

removing said polymer and said mask;

implanting second ions into said semiconductor substrate whereby lightly doped source and drain regions are formed within said semiconductor substrate which was covered by said polymer;

depositing an insulating layer over the surface of said substrate;

etching an opening through said insulating layer to one of said source and drain regions;

depositing a conducting layer overlying said insulating layer and within said opening and patterning said conducting layer completing the fabrication of said integrated circuit device.

2. The method according to claim 1 wherein said gate silicon oxide layer has a thickness of between about 50 to 150 Angstroms.

3. The method according to claim 1 wherein said gate conducting layer is formed by depositing polysilicon by low pressure chemical vapor deposition to a thickness of between about 2500 to 4500 Angstroms.

4. The method according to claim 1 wherein said gate conducting layer is formed by the following steps:

depositing a first layer of polysilicon by low pressure chemical vapor deposition overlying said gate silicon oxide layer to a thickness of between about 1400 to 2000 Angstroms;

depositing tungsten silicide by chemical vapor deposition overlying said first polysilicon layer to a thickness of between about 1200 to 1700 Angstroms; and depositing a second layer of polysilicon by low pressure chemical vapor deposition overlying said tungsten silicide layer to a thickness of between about 450 to 650 Angstroms wherein the total thickness of said gate conducting layer is between about 3050 to 4350 Angstroms.

5. The method according to claim 1 wherein said etching away of said gate conducting layer comprises flowing HBr plasma at the rate of between about 50 to 200 sccm and flowing O2 plasma at a rate of between about 1 to 8 sccm at a pressure of between about 5 to 10 mTorr wherein said etching away of said gate conducting layer is completed and whereby said polymer is formed.

6. The method according to claim 1 wherein said etching away of said gate conducting layer comprises:

flowing HBr plasma at the rate of between about 50 to 200 sccm and flowing O2 plasma at a rate of between about 1 to 8 sccm at a pressure of between about 5 to 10 mTorr wherein said etching away of said gate conducting layer is completed; and flowing HBr plasma at the rate of between about 50 to 200 sccm and flowing said O2 plasma at a rate of more than about 5 sccm whereby said polymer is formed.

7. The method according to claim 1 wherein said etching away of said gate conducting layer comprises:

etching of said gate conducting layer using a plasma; and adding unsaturated hydrocarbons to said plasma whereby said polymer is formed.

8. The method according to claim 1 wherein said unsaturated hydrocarbons comprise one of the group consisting of propene and methyl methacrylate.

9. The method according to claim 1 wherein said unsaturated hydrocarbons comprise one of the group consisting of propene, styrene, and methyl methacrylate.

10. The method according to claim 1 wherein said first ions are arsenic ions implanted at a dosage of between about 1 E 15 to 8 E 15 atoms/cm$^2$ and an energy of between about 50 to 90 KeV.

11. The method according to claim 1 wherein said first ions are phosphorus ions implanted at a dosage of between about 1 E 15 to 8 E 15 atoms/cm$^2$ and an energy of between about 30 to 80 KeV.

12. The method according to claim 1 wherein said source and drain regions have a dopant concentration of between about 1 E 19 to 1 E 22 atoms/cm$^3$.

13. The method according to claim 1 wherein said polymer is removed by stripping with a solution of EKC 265 at a temperature of between about 60° to 100° C.

14. The method according to claim 1 wherein said polymer is removed by stripping with a solution of NH$_4$OH/H$_2$O$_2$ at a temperature of between about 40° to 80° C.

15. The method according to claim 1 wherein said mask is removed by oxygen ashing in plasma.

16. The method according to claim 1 wherein said mask is removed by hot sulfuric peroxide.

17. The method according to claim 1 wherein said second ions are arsenic ions implanted with a dosage of between about 5 E 12 to 1 E 14 atoms/cm$^2$ and an energy of between about 50 to 90 KeV.

18. The method according to claim 1 wherein said second ions are phosphorus ions implanted with a dosage of between about 5 E 12 to 1 E 14 atoms/cm$^2$ and an energy of between about 30 to 80 KeV.

19. The method according to claim 1 wherein said lightly doped source and drain regions have a dopant concentration of between about 1 E 17 to 1 E 19 atoms/cm$^3$.

20. A method of forming a lightly doped source and drain structure in the fabrication of an integrated circuit device comprising:

providing a layer of gate silicon oxide over the surface of a semiconductor substrate;

providing a polycide layer overlying said gate silicon oxide layer;

covering said polycide layer with a photoresist layer and patterning said photoresist layer to form a mask;

etching away said polycide layer where it is not covered by said mask to form gate electrodes whereby a polymer is formed on the sidewalls of said mask and said gate electrodes;

implanting first ions into said semiconductor substrate not covered by said mask and said polymer to form source and drain regions;

removing said polymer and said mask; and implanting second ions into said semiconductor substrate whereby lightly doped source and drain regions are formed within said semiconductor substrate which was covered by said polymer completing the formation of a lightly doped source and drain structure in the fabrication of an integrated circuit device.

21. The method according to claim 20 wherein said gate silicon oxide layer has a thickness of between about 50 to 125 Angstroms.

22. The method according to claim 20 wherein said polycide layer is formed by the following steps:

depositing a first layer of polysilicon by low pressure chemical vapor deposition overlying said gate silicon oxide layer to a thickness of between about 1400 to 2000 Angstroms;

depositing tungsten silicide by chemical vapor deposition overlying said first polysilicon layer to a thickness of between about 1200 to 1700 Angstroms; and depositing a second layer of polysilicon by low pressure chemical vapor deposition overlying said tungsten silicide layer to a thickness of between about 450 to 650 Angstroms wherein the total thickness of said polycide layer is between about 3050 to 4350 Angstroms.

23. The method according to claim 20 wherein said etching away of said polycide layer comprises flowing HBr plasma at the rate of between about 50 to 200 sccm and flowing O2 plasma at a rate of between about 1 to 8 sccm at a pressure of between about 5 to 10 mTorr wherein said etching away of said polycide layer is completed and whereby said polymer is formed.

24. The method according to claim 20 wherein said etching away of said polycide layer comprises:

flowing HBr plasma at the rate of between about 50 to 200 sccm and flowing O2 plasma at a rate of between about 1 to 8 sccm at a pressure of between about 5 to 10 mTorr wherein said etching away of said polycide layer is completed; and thereafter flowing HBr plasma at the rate of between about 50 to 200 sccm and flowing said O2 plasma at a rate of more than about 5 sccm whereby said polymer is formed.

25. The method according to claim 20 wherein said etching away of said polycide layer comprises:

etching of said polycide layer using a plasma; and thereafter adding unsaturated hydrocarbons to said plasma whereby said polymer is formed.

26. The method according to claim 20 wherein said unsaturated hydrocarbons comprise one of the group consisting of propene and methyl methacrylate.

27. The method according to claim 20 wherein said unsaturated hydrocarbons comprise one of the group consisting of propene, styrene, and methyl methacrylate.

28. The method according to claim 20 wherein said first ions are arsenic ions implanted at a dosage of between about 1 E 15 to 8 E 15 atoms/cm$^2$ and an energy of between about 50 to 90 KeV.

29. The method according to claim 20 wherein said source and drain regions have a dopant concentration of between about 1 E 19 to 1 E 22 atoms/cm$^3$.

30. The method according to claim 20 wherein said polymer is removed by stripping with a solution of EKC 256 at a temperature of between about 60° to 100° C.

31. The method according to claim 20 wherein said polymer is removed by stripping with a solution of $NH_4OH$/$H_2O_2$ at a temperature of between about 40° to 80° C.

32. The method according to claim 20 wherein said second ions are phosphorus ions implanted with a dosage of between about 5 E 12 to 1 E 14 atoms/cm$^2$ and an energy of between about 30 to 80 KeV.

33. The method according to claim 20 wherein said lightly doped source and drain regions have a dopant concentration of between about 1 E 17 to 1 E 19 atoms/cm$^3$.

\* \* \* \* \*